(12) United States Patent
Bechtel et al.

(10) Patent No.: US 10,121,770 B2
(45) Date of Patent: Nov. 6, 2018

(54) DEVICE WITH MULTIPLE, STACKED LIGHT EMITTING DEVICES

(71) Applicant: KONINKLIJKE PHILIPS N.V., Eindhoven (NL)

(72) Inventors: Hans-Helmut Bechtel, Aachen (DE); Erik Nelson, Aachen (DE); April Dawn Schricker, Aachen (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 15/551,381

(22) PCT Filed: Feb. 10, 2016

(86) PCT No.: PCT/EP2016/052779
§ 371 (c)(1),
(2) Date: Aug. 16, 2017

(87) PCT Pub. No.: WO2016/131686
PCT Pub. Date: Aug. 25, 2016

(65) Prior Publication Data
US 2018/0068988 A1     Mar. 8, 2018

Related U.S. Application Data

(60) Provisional application No. 62/117,497, filed on Feb. 18, 2015.

(51) Int. Cl.
*H01L 25/075*     (2006.01)
*H01L 27/15*      (2006.01)

(52) U.S. Cl.
CPC .......... *H01L 25/0756* (2013.01); *H01L 27/15* (2013.01); *H01L 2224/32145* (2013.01); *H01L 2224/48465* (2013.01); *H01L 2224/73265* (2013.01)

(58) Field of Classification Search
CPC ............................. H01L 25/0756; H01L 27/15
See application file for complete search history.

(56) References Cited

U.S. PATENT DOCUMENTS

| | | | |
|---|---|---|---|
| 8,735,913 B2 * | 5/2014 | Kuo .................... | H01L 25/0756 257/777 |
| 2006/0267026 A1 | 11/2006 | Kim et al. | |
| 2010/0109028 A1 | 5/2010 | Chen et al. | |
| 2010/0252103 A1 * | 10/2010 | Yao ..................... | H01L 25/0756 136/256 |
| 2012/0248473 A1 | 10/2012 | Kuo | |

OTHER PUBLICATIONS

EPO as ISA, "International Search Report and Written Opinion" dated Apr. 1, 2016 from International Application No. PCT/EP2016/052779, filed Feb. 10, 2016, 10 pages.

* cited by examiner

Primary Examiner — Jose R Diaz
(74) Attorney, Agent, or Firm — Brian D. Ogonowsky; Patent Law Group LLP

(57) ABSTRACT

A device according to embodiments of the invention includes a first semiconductor light emitting layer disposed between a first n-type region and a first p-type region. A second semiconductor light emitting layer disposed between a second n-type region and a second p-type region is disposed over the first semiconductor light emitting layer. A non-III-nitride material separates the first and second light emitting layers.

15 Claims, 2 Drawing Sheets

DEVICE WITH MULTIPLE, STACKED LIGHT EMITTING DEVICES

CROSS-REFERENCE TO RELATED APPLICATIONS

The present application is a § 371 application of International Application No. PCT/EP2016/052779 filed on Feb. 10, 2016 and entitled "DEVICE WITH MULTIPLE, STACKED LIGHT EMITTING DEVICES," which claims the benefit of U.S. Provisional Patent Application No. 62/117,497.4 filed on Feb. 18, 2015. International Application No. PCT/EP2016/052779 and U.S. Provisional Patent Application No. 62/117,497 are incorporated herein.

FIELD OF THE INVENTION

The present invention relates to a device with multiple, stacked light emitting devices such as light emitting diodes.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

The amount of light generated by an LED is generally proportional to the current applied to the LED. As more current is applied, more light is generated. However, as the current density applied to an LED increases, the external quantum efficiency of the LED initially increases to a peak at fairly low current density, then decreases at high current density. Accordingly, many LEDs operate most efficiently at fairly low current density.

Some applications such as, for example, automotive applications, require high light output in a relatively small source size. In order to generate the light output required, a single LED must be operated at a current density that is generally higher than the current density at which the LED is most efficient, in order to generate enough light. Because the source size must be small, in some applications it is not possible to generate the needed light output with multiple LEDs operated at lower current density, placed side by side.

SUMMARY

It is an object of the invention to provide a device with high light output and a small source size.

A device according to embodiments of the invention includes a first semiconductor light emitting layer disposed between a first n-type region and a first p-type region. A second semiconductor light emitting layer disposed between a second n-type region and a second p-type region is disposed over the first semiconductor light emitting layer. A non-III-nitride material separates the first and second light emitting layers.

DETAILED DESCRIPTION

In embodiments of the invention, multiple light emitting devices such as LEDs are stacked. Stacking multiple LEDs in a single device may increase the amount of light generated by the device, while preserving a small source size such as, for example, a source size corresponding to the footprint of a single LED. Though the examples below illustrate two stacked LEDs, the techniques and structures described herein may be expanded to an arbitrary number of stacked LEDs.

Though in the examples below the semiconductor light emitting device are III-nitride LEDs that emit blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used. The stacked LEDs in a single device are often made from the same materials and emit substantially the same color light, though this is not required. The materials used must be suitably transparent where transparent LEDs are required, as described below.

Figure 1:
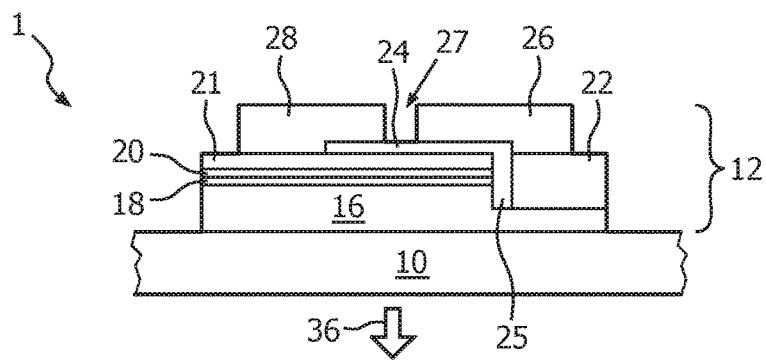
FIGS. 1 and 2 are cross sectional views of LEDs that may be used with embodiments of the present invention.
Figure 2:
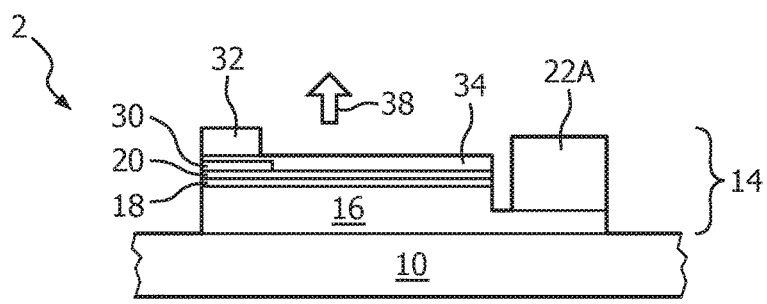

FIGS. 1 and 2 illustrate III-nitride LEDs 1 and 2 that may be used in embodiments of the present invention. Any suitable semiconductor light emitting device may be used and embodiments of the invention are not limited to the LEDs illustrated in FIGS. 1 and 2. In FIG. 1, a majority of light is extracted from the LED through the growth substrate. Such a device may be referred to as a flip chip device. In FIG. 2, a majority of light is extracted from the LED through the top surface, the surface opposite the growth substrate and on which the electrical contacts are formed. Such a device may be referred to as a lateral device.

Each of the devices illustrated in FIGS. 1 and 2 is formed by growing a III-nitride semiconductor structure on a growth substrate 10 as is known in the art. The growth substrate is often sapphire but may be any suitable substrate such as, for example, a non-III-nitride material, SiC, Si, GaN, or a composite substrate. A surface of the growth substrate on which the III-nitride semiconductor structure is grown may be patterned, roughened, or textured before growth, which may improve light extraction from the device. A surface of the growth substrate opposite the growth surface (i.e. the surface through which a majority of light is extracted in a flip chip configuration) may be patterned, roughened or textured before or after growth, which may improve light extraction from the device.

The semiconductor structure includes a light emitting or active region sandwiched between n- and p-type regions. An n-type region 16 may be grown first and may include multiple layers of different compositions and dopant concentration including, for example, preparation layers such as buffer layers or nucleation layers, which may be n-type or not intentionally doped, and n- or even p-type device layers designed for particular optical, material, or electrical properties desirable for the light emitting region to efficiently emit light. A light emitting or active region 18 is grown over the n-type region. Examples of suitable light emitting regions include a single thick or thin light emitting layer, or a multiple quantum well light emitting region including multiple thin or thick light emitting layers separated by barrier layers. A p-type region 20 may then be grown over the light emitting region. Like the n-type region, the p-type region may include multiple layers of different composition, thickness, and dopant concentration, including layers that are not intentionally doped, or n-type layers.

In the device of FIG. 1, after growth of the semiconductor structure, a reflective p-contact is formed on the surface of the p-type region. The p-contact 21 often includes multiple conductive layers such as a reflective metal and a guard metal which may prevent or reduce electromigration of the reflective metal. The reflective metal is often silver but any suitable material or materials may be used. After forming the p-contact 21, a portion of the p-contact 21, the p-type region 20, and the active region 18 is removed to expose a portion of the n-type region 16 on which an n-contact 22 is formed. The n- and p-contacts 22 and 21 are electrically isolated from each other by a gap 25 which may be filled with a dielectric such as an oxide of silicon or any other suitable material. Multiple n-contact vias may be formed; the n- and p-contacts 22 and 21 are not limited to the arrangement illustrated in FIG. 1. The n- and p-contacts may be redistributed to form bond pads with a dielectric/metal stack, as is known in the art.

In order to electrically and physically attach the LED to another structure, one or more interconnects 26 and 28 are formed on or electrically connected to the n- and p-contacts 22 and 21. Interconnect 26 is electrically connected to n-contact 22 in FIG. 1. Interconnect 28 is electrically connected to p-contact 21. Interconnects 26 and 28 are electrically isolated from the n- and p-contacts 22 and 21 and from each other by dielectric layer 24 and gap 27. Interconnects 26 and 28 may be, for example, solder, stud bumps, gold layers, or any other suitable structure. Many individual LEDs are formed on a single wafer then diced from the wafer of devices. The substrate 10 may be thinned after growth of the semiconductor structure or after forming the individual devices as described above in reference to FIG. 1. In some embodiments, the substrate is removed from the device of FIG. 1.

The device illustrated in FIG. 1 is represented in the following figures by block 1. The semiconductor structure, the n- and p-contacts 22 and 21, and the interconnects 26 and 28 (all the elements except the substrate) are represented in the following figures by block 12.

A majority of light extracted from the device of FIG. 1 is extracted through the substrate 10 (or the surface of the semiconductor structure exposed by removing the substrate 10), as indicated by arrow 36.

In the device of FIG. 2, a portion of the p-type region 20 and the active region 18 is removed to expose a portion of the n-type region 16 on which an n-contact 22A is formed.

On the remaining p-type region 20, an insulating layer 30 is formed where a bonding pad 32 will later be formed. Insulating layer 30 may be, for example, one or more oxides of silicon, nitrides of silicon, or any other suitable structure.

A transparent, conductive layer 34 is formed over the insulating layer and the portion of the p-type region 20 not covered by the insulating layer. Transparent conductive layer 34 may be, for example, a conductive oxide such as indium tin oxide, or a transparent metal layer, such as one or more thin layers of gold, silver, and/or aluminum. Transparent conductive layers 34 that are metal may be coated in some embodiments with thin dielectric layers of, for example, oxide or any other suitable material, which may improve transmission of visible light.

The bonding pad 32 is formed over the transparent, conductive layer, aligned with the insulating layer 30. Bonding pad 32 may be, for example, metal, gold, or any other suitable structure. The insulating layer 30 reduces the amount of light generated beneath bonding pad 32 by preventing current from being injected directly beneath bonding pad 32. Bonding pad 32 is generally absorbing of light. Electrical connections to the device of FIG. 2 are made by wire bonds or any other suitable structure. Wire bonds may connect to the top surfaces of bonding pad 32 and n-contact 22A, as shown in the following figures.

The device illustrated in FIG. 2 is represented in the following figures by block 2. The semiconductor structure, the n-contact 22A, the insulating layer 30, conductive layer 34, and bonding pad 32 (all of the elements except the substrate) are represented in the following figures by block 14.

A majority of light extracted from the device of FIG. 2 is extracted through the transparent conductive layer 34, as indicated by arrow 38.

The device illustrated in FIG. 1 is a flip chip device, which is often operated at higher current than the device illustrated in FIG. 2, which is a lateral device. For example, the flip chip device of FIG. 1 may be operated at current greater 0.75 A (1 A, for example, may be typical), while the lateral device of FIG. 2 may be operated at current less than 0.75 A (0.35 A, for example, may be typical). Though the devices described herein may be operated under any suitable conditions, flip chip devices such as the device of FIG. 1 may be referred to herein as "high power" devices, while lateral devices such as the device of FIG. 2 may be referred to herein as "mid power" devices.

The lateral device of FIG. 2 is substantially transparent, while in the flip chip device of FIG. 1, light may only be extracted through the surface opposite the opaque contacts and interconnects. Accordingly, in a structure with an opaque mount where light is extracted from the structure from the top surface (opposite the mount) such as the structures illustrated below in FIGS. 3, 4, and 5, the flip chip device of FIG. 1 is suitable only as the bottom device, the device closest to the mount. (In contrast, the substantially transparent lateral device of FIG. 2 may be used as a top, bottom, or middle device.) In a structure where light is extracted through a transparent mount, the flip chip device of FIG. 1 may be suitable only as the top device, the device furthest from the mount.

Figure 3:
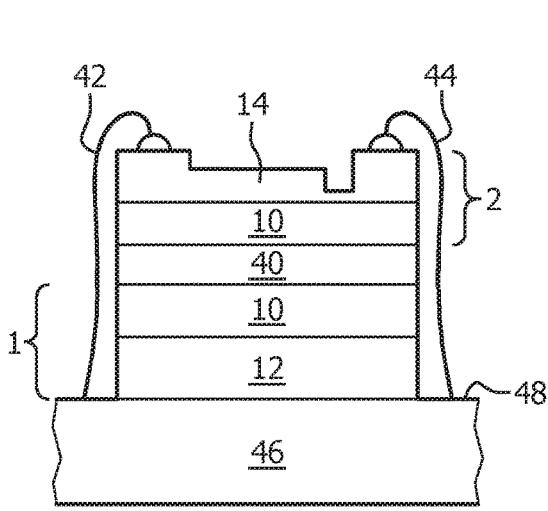
FIG. 3 illustrates a device with an LED as illustrated in FIG. 2 stacked over an LED as illustrated in FIG. 1.

FIG. 3 illustrates a first example of a stacked, multi junction device. In the device of FIG. 3, a flip chip device such as the LED illustrated in FIG. 1 is attached to a mount 46. A lateral device such as the LED illustrated in FIG. 2 is attached to LED 1.

Mount 46 may be any suitable structure, such as, for example, a ceramic substrate with conductive bonding pads, a metal substrate with at least one insulating layer for electrical isolation, or a PC board. A top surface 48 of mount 46 includes bonding pads for electrical connection to both LED 1, mounted directly on mount 46, and LED 2, mounted on LED 1. Mount 46 may include surface and/or embedded electrical traces, in order to electrically connect LEDs 1 and 2 to each other, for example in series, in parallel, or in any other suitable configuration. In some embodiments, traces are formed on or in mount 46 in order to individually address LEDs 1 and 2. LEDs 1 and 2 may be connected to the same or different driver circuits, such that LEDs 1 and 2 may be operated at different drive currents, in order to operate each LED at or near its optimal drive current.

LED 1 may be picked and placed on mount 46, then attached via solder, metal interconnects, gold interconnects, conductive glue, or any other suitable material or bond. LED 1 is mounted with the contacts closest to the mount 46, and with the substrate 10 furthest from the mount.

A transparent adhesive 40 is disposed over the substrate 10 of LED 1. The transparent adhesive is selected to form a strong bond between LED 1 and LED 2 (for example, the adhesive may have a mechanical strength of at least shore A 60 in some embodiments) and to resist yellowing when exposed to light from LEDs 1 and 2. Any suitable adhesive may be used including, for example, one or more non-III-nitride materials, silicone, epoxy, attach glues, polydimethylsiloxane (PDMS), benzocyclobutene (BCB), or 2,9-dimethyl-4,7-diphenyl-1,10-phenanthroline (BCP).

In some embodiments, wavelength converting material, material to improve light extraction and/or create scattering, material to alter the refractive index of the adhesive, or any other suitable material may be disposed in any of the transparent adhesive layers described herein.

LED 2 is attached to LED 1 via transparent adhesive 40. LED 2 is disposed over LED 1 with the growth substrate 10 of LED 2 attached to the growth substrate 10 of LED 1. Accordingly, the transparent adhesive 40 does not interfere with the contacts of either LED 1 or LED 2. After attaching LED 2 to LED 1, wire bonds 42 and 44 may connect the p-bonding pad 32 and the n-contact 22A, respectively, of LED 2 to electrical connections disposed on the top surface 48 of mount 46.

Figure 4:
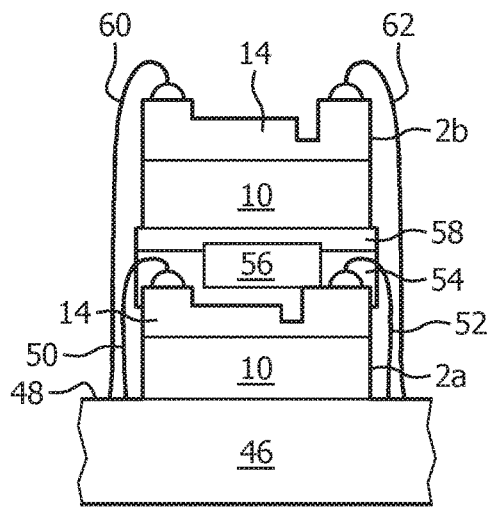
FIG. 4 illustrates a device with two stacked LEDs as illustrated in FIG. 2.

FIG. 4 illustrates a second example of a stacked, multi junction device. In the device of FIG. 4, a lateral device such as the LED illustrated in FIG. 2 is attached to the top surface 48 of a mount 46. A second lateral device such as the LED illustrated in FIG. 2 is stacked over the first lateral device.

As described above in reference to FIG. 3, mount 46 may be any suitable structure. A first LED 2a is attached to mount 46 through the growth substrate 10, by, for example, Au/Sn solder or any other suitable material and/or process. Wire bonds 50 and 52 electrically connect bonding pads on mount 46 to p-bonding pad 32 and n-contact 22A of LED 2a.

A transparent adhesive material 54, such as one or more of the adhesives described above in reference to FIG. 3, is disposed over LED 2a.

A transparent separator 56 is attached to LED 2a via adhesive material 54. Transparent separator 56 spaces the second LED 2b apart from LED 2a, in order to protect the wirebonds 50, 52 which electrically connect LED 2a to mount 46. Accordingly, as illustrated in FIG. 4, transparent separator 56 is narrower than the spacing of the wirebond connections on LED 2a, and taller than the tops of the wirebonds 50, 52, such that LED 2b does not crush the wirebonds. Transparent separator 56 is selected to be highly transparent, mechanically robust, and tolerant of the temperatures and flux at which LEDs 2a and 2b are operated. In some embodiments, the refractive index of transparent separator 56 and adhesive 54 may be selected to efficiently extract light from LED 2a. Transparent separator 56 may be, for example, sapphire, glass, transparent ceramic, silicone (such as, for example, previously cured and singulated high refractive index silicone), or any other suitable material. In some embodiments, transparent separator 56 is selected to be highly transparent and mechanically robust at high operating temperatures, for example, temperatures in excess of 100° C. in some embodiments. The refractive index of the transparent separator 56 may be selected to maximize the blue light extraction in some embodiments. The refractive index of the transparent separator may be at least 1.6 in some embodiments, at least 1.7 in some embodiments, and no more than 2.2 in some embodiments.

In some embodiments, transparent separator 56 is a wavelength converting structure, such as a ceramic phosphor. In some embodiments, light from LED 2a is fully converted by a wavelength converting transparent separator, then the color of the combined light extracted from the structure is adjusted by LED 2b. Such a device may be used with or without an additional wavelength converting material disposed over the top of the device, as described below in reference to FIG. 6.

After attaching transparent separator 56 to LED 2a, adhesive material 54 typically is fully cured.

A second transparent adhesive material 58, such as one or more of the adhesives described above in reference to FIG. 3, is disposed over transparent separator 56. Second adhesive material 58 may be the same as transparent adhesive 54, though this is not required. A second LED 2b is attached to transparent separator 56 by second adhesive material 58, then the second adhesive material 58 is fully cured. Second LED 2b is attached to transparent separator 56 via adhesive material 58 through the growth substrate 10. After attaching LED 2b to separator 56, wirebonds 60, 62 electrically connect bonding pads on mount 46 to p-bonding pad 32 and n-contact 22A of LED 2b.

Figures 5, 6:
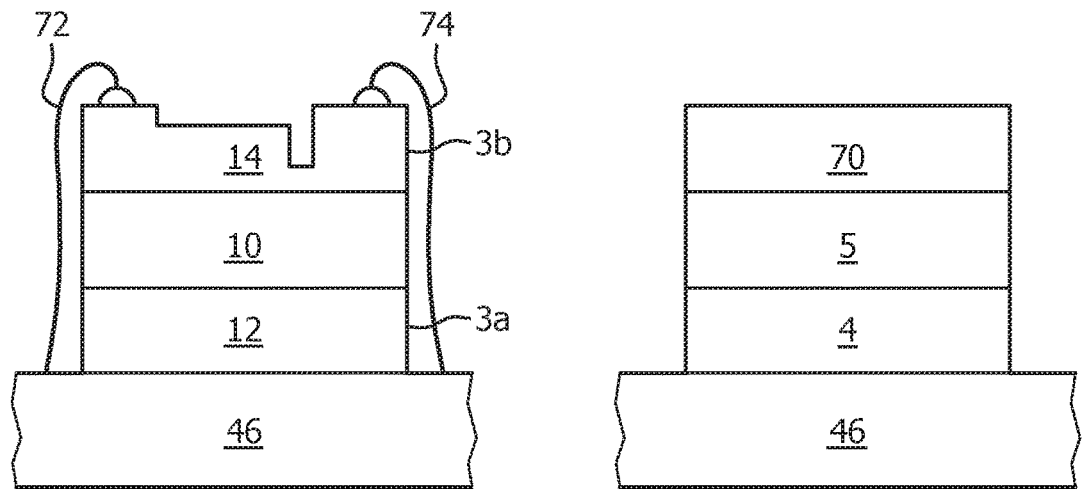
FIG. 5 illustrates a device with two stacked LEDs grown on opposite sides of a single growth substrate.
FIG. 6 illustrates a device with two stacked LEDs and a wavelength converting element.

FIG. 5 illustrates a third example of a stacked, multi junction device. In the device of FIG. 5, two LEDs 3a and 3b are grown on opposite sides of a single growth substrate 10. For example, a first semiconductor structure that is formed into LED 3a is grown first on growth substrate 10, then the growth substrate 10 is flipped over and a second semiconductor structure that is formed into LED 3b is grown on the back side of the growth substrate 10. In some embodiments, the two semiconductor structures may be grown simultaneously.

The semiconductor structures are then formed into LEDs. LED 3a may be a device that is mounted contact-side down, such that light is extracted through growth substrate 10. One example of such a structure is the device illustrated in FIG. 1. LED 3b may be a device that is mounted contact-side up, such that light is extracted through contacts formed on the semiconductor structure. One example of such a structure is the device illustrated in FIG. 2. The structure is attached to a mount 46 via the contacts of LED 3a. Wirebonds 72 and 74, or any other suitable electrical connection structure, connect the p-bonding pad and n-contact of LED 3b to electrical pads on mount 46.

FIG. 6 illustrates a wavelength converted device with multiple stacked LEDs. First and second LEDs 4 and 5 are stacked on a mount 46. First and second LEDs 4 and 5 may be any of the structures described above. A wavelength converting element 70 is formed over the top surface of the top LED 5, the LED furthest from mount 46.

The wavelength converting element 70 includes one or more wavelength converting materials which may be, for example, conventional phosphors, organic phosphors, quantum dots, organic semiconductors, II-VI or III-V semiconductors, II-VI or III-V semiconductor quantum dots or nanocrystals, dyes, polymers, or other materials that luminesce. The wavelength converting material absorbs light emitted by the LED and emits light of one or more different wavelengths. Unconverted light emitted by the LED is often part of the final spectrum of light extracted from the structure, though it need not be. The final spectrum of light extracted from the structure may be white or monochromatic. Examples of common combinations include a blue-emitting LED combined with a yellow-emitting wavelength converting material, a blue-emitting LED combined with green- and red-emitting wavelength converting materials, a UV-emitting LED combined with blue- and yellow-emitting wavelength converting materials, and a UV-emitting LED combined with blue-, green-, and red-emitting wavelength converting materials. Wavelength converting materials emitting other colors of light may be added to tailor the spectrum of light extracted from the structure.

In some embodiments, wavelength converting element 70 is a structure that is fabricated separately from the LEDs and attached to the top LED, for example through wafer bonding or a suitable adhesive such as silicone or epoxy. One example of such a pre-fabricated wavelength converting element is a ceramic phosphor, which is formed by, for example, sintering powder phosphor or the precursor materials of phosphor into a ceramic slab, which may then be diced into individual wavelength converting elements. A ceramic phosphor may also be formed by, for example tape casting, where the ceramic is fabricated to the correct shape, with no dicing or cutting necessary. Examples of suitable non-ceramic pre-formed wavelength converting elements include powder phosphors that are disposed in transparent material such as silicone or glass that is rolled, cast, or otherwise formed into a sheet, then singulated into individual wavelength converting elements, and phosphor mixed with silicone and disposed on a transparent substrate.

Figure 7:
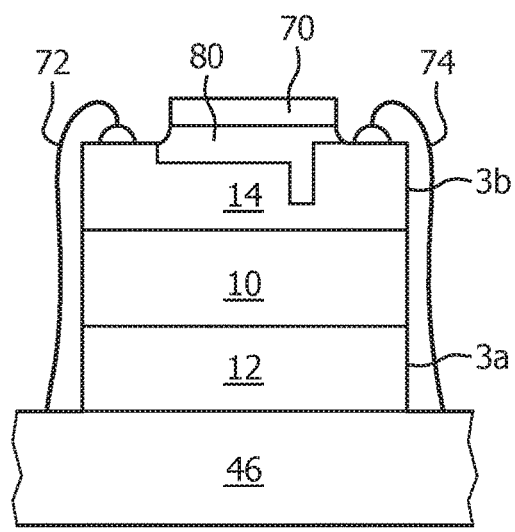
FIG. 7 illustrates the device of FIG. 5 with a wavelength converting element.

FIG. 7 illustrates the device of FIG. 5 with a wavelength converting element 70 attached to LED 3b by a layer of adhesive material 80. A wavelength converting element 70 may be disposed over the devices of FIGS. 3 and 4 in a similar matter.

A reflective material may be disposed on the sides of the LEDs and the wavelength converting element, in order to force light to exit the device through the top surface.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

The invention claimed is:

1. A device comprising:
a first light emitting structure including a first semiconductor light emitting layer disposed between a first n-type region and a first p-type region;
a second light emitting structure including a second semiconductor light emitting layer disposed between a second n-type region and a second p-type region; and
a non-III-nitride material separating the first and second light emitting structures, the non-III-nitride material comprising an adhesive attaching the first and second light emitting structures;
the second semiconductor light emitting layer being disposed over the first semiconductor light emitting layer, wherein the non-III-nitride material separating the first and second light emitting structures comprises a wavelength converting material.

2. The device of claim 1 wherein:
the first n-type region, the first light emitting layer, and the first p-type region are grown on a first growth substrate; and
the second n-type region, the second light emitting layer, and the second p-type region are grown on a second growth substrate.

3. The device of claim 2 further comprising:
a first contact electrically connected to the first n-type region; and
a second contact electrically connected to the first p-type region.

4. The device of claim 3 further comprising:
a third contact electrically connected to the second n-type region;
a fourth contact electrically connected to the second p-type region;
a first wire bond connecting the third contact to a mount; and
a second wire bond connecting the third contact to the mount.

5. The device of claim 3 further comprising:
a first wire bond connecting the first contact to a mount; and
a second wire bond connecting the second contact to the mount.

6. The device of claim 5 further comprising:
a third contact electrically connected to the second n-type region;
a fourth contact electrically connected to the second p-type region;
a third wire bond connecting the third contact to the mount; and
a fourth wire bond connecting the fourth contact to the mount.

7. The device of claim 5 wherein the non-III-nitride material separating the first and second light emitting structures further comprises a separator, wherein the separator spaces the second light emitting structure apart from the first light emitting structure and protects the first and second wire bonds.

8. The device of claim 2 wherein the non-III-nitride material separating the first and second light emitting structures further comprises a separator, wherein the adhesive comprises:
a first adhesive layer attaching the first p-type region to the separator; and
a second adhesive layer attaching the second growth substrate to the separator.

9. The device of claim 1 wherein the wavelength converting material is disposed in the adhesive.

10. The device of claim 1 wherein the non-III-nitride material separating the first and second light emitting structures further comprises a separator, wherein the separator is comprised of the wavelength converting material.

11. The device of claim 8 wherein the first growth substrate is attached to a mount.

12. A device comprising:

a growth substrate made of a non-III-nitride material and having a first surface and a second surface opposite the first surface;

a first light emitting structure including a first semiconductor light emitting layer disposed between a first n-type region and a first p-type region, the first semiconductor light emitting layer, the first n-type region, and the first p-type region being grown on the first surface of the growth substrate; and a second light emitting structure including a second semiconductor light emitting layer disposed between a second n-type region and a second p-type region, the second semiconductor light emitting layer, the second n-type region, and the second p-type region being grown on the second surface of the growth substrate.

13. The device of claim 12 wherein the first light emitting device is mounted contact side down on a mount; and the second light emitting device is wire bonded to the mount.

14. A method comprising:

growing a first semiconductor structure comprising a first light emitting layer sandwiched between a first n-type region and a first p-type region on a first surface of a non-III-nitride growth substrate; and growing a second semiconductor structure comprising a second light emitting layer sandwiched between a second n-type region and a second p-type region on a second surface of the non-III-nitride growth substrate, the second surface being opposite the first surface.

15. The method of claim 14 further comprising:

attaching the first semiconductor structure to a mount via a first contact disposed on the first n-type region and a second contact disposed on the first p-type region;

forming a first wire bond between the mount and a third contact disposed on the second n-type region; and forming a second wire bond between the mount and a fourth contact disposed on the second p-type region.

* * * * *